(12) United States Patent
Kozko

(10) Patent No.: US 9,563,105 B1
(45) Date of Patent: Feb. 7, 2017

(54) SCREW COUPLER ENABLING DIRECT SECURE FASTENING BETWEEN COMMUNICATING ELECTRONIC COMPONENTS

(71) Applicant: Dmitry Kozko, Aventura, FL (US)

(72) Inventor: Dmitry Kozko, Aventura, FL (US)

(73) Assignee: IC REAL TECH INC., Pompano Beach, FL (US)

( * ) Notice: Subject to any disclaimer, the term of this patent is extended or adjusted under 35 U.S.C. 154(b) by 110 days.

(21) Appl. No.: 14/035,326

(22) Filed: Sep. 24, 2013

Related U.S. Application Data

(60) Provisional application No. 61/853,711, filed on Apr. 10, 2013, provisional application No. 61/854,397, filed on Apr. 23, 2013.

(51) Int. Cl.
*G03B 17/02* (2006.01)
*G03B 17/08* (2006.01)

(52) U.S. Cl.
CPC ............... *G03B 17/02* (2013.01); *G03B 17/08* (2013.01)

(58) Field of Classification Search
CPC ......... G03B 17/08; G03B 17/56; G03B 17/48; H04N 5/2252; H04N 1/00249; H04N 5/225; H04N 2101/00; H04N 5/232; H04N 5/2259; H04N 5/23203; H04N 5/23209; F16M 11/04; F16M 11/08; F16M 11/18; F16M 13/00; H01M 10/46; H02J 2007/0062
USPC .......... 396/25, 419, 428, 429; 348/372, 375, 348/207.1, 207.11, 211.4, 211.9, 211.11, 348/211.14; 320/108, 115
See application file for complete search history.

(56) References Cited

U.S. PATENT DOCUMENTS

| | | | | | |
|---|---|---|---|---|---|
| 4,888,639 | A | * | 12/1989 | Yabe | A61B 1/05 348/69 |
| 5,246,379 | A | * | 9/1993 | Wright | H01R 13/622 439/320 |
| 6,335,759 | B1 | * | 1/2002 | Harada | H04N 5/2254 257/432 |
| 6,449,438 | B1 | * | 9/2002 | Gennetten | F16M 11/02 248/187.1 |
| 2003/0007321 | A1 | * | 1/2003 | Dayley | G06F 1/181 361/679.6 |
| 2003/0210333 | A1 | * | 11/2003 | Manico | G06F 1/1601 348/220.1 |
| 2007/0162095 | A1 | * | 7/2007 | Kimmel | A61B 1/00089 600/109 |
| 2008/0070500 | A1 | * | 3/2008 | Rapp | H04N 5/2251 455/41.1 |
| 2009/0068892 | A1 | * | 3/2009 | Godovich | H01R 13/746 439/620.01 |
| 2010/0165188 | A1 | * | 7/2010 | Jannard | H04N 5/225 348/375 |
| 2012/0013293 | A1 | * | 1/2012 | Chu | 320/108 |

(Continued)

*Primary Examiner* — Rochelle-Ann J Blackman
(74) *Attorney, Agent, or Firm* — Patents on Demand P.A.; Brian K. Buchheit; Scott M. Garrett

(57) ABSTRACT

A screw based coupler mechanism can include a head, a shank, and/or a helical ridge wrapped around the shank. The shank can include an electronic connector with one or more electronic pin outs. The shank can be configured to be physically and electronically mated to an electronic device. The electronic device can include a base and a hollow region surrounded by a matching helical ridge which securely mate the component to the shank. In one embodiment, the electronic device can be a panoramic camera which can be secured to a screw based coupler of a mounting platform.

13 Claims, 5 Drawing Sheets

(56) References Cited

U.S. PATENT DOCUMENTS

2014/0227896 A1* 8/2014 Fullerton .......... H01R 13/6205
439/236

* cited by examiner

400

Hollow Core Coupler with Internal Threads 410

*Side View 412*

Top Connecting Embodiment 440

*Isometric View 452*

SCREW COUPLER ENABLING DIRECT SECURE FASTENING BETWEEN COMMUNICATING ELECTRONIC COMPONENTS

CROSS-REFERENCE TO RELATED APPLICATIONS

This application claims priority to provisional application No. 61/853,711, entitled "System and Method for Stitching Videos Received from Multiple Unsynchronized Cameras", filed Apr. 10, 2013, as well as provisional application No. 61/854,397, entitled "360 Degrees Cameras", filed Apr. 23, 2013. Both provisional applications are hereby included in their entirety.

BACKGROUND

The present invention relates to the field of electronic coupling and, more particularly, to a screw coupler enabling direct secure fastening between communicating electronic components.

Electronic devices such as cameras are rising in popularity within the sporting industry and activities. Cameras have traditionally been used to present a third person view of a sporting event. However, there is an increasing demand for first person and second person views of a sporting event since these views capture the audience's attention easily. For example, a car of a racing driver is often outfitted with several cameras which allow audiences to view the driver's activities during the race. These cameras are typically mounted using a variety of attachment systems such as clamps and suction mounts. However, these mechanisms are prone to breaking and uncoupling during critical activities. For example, when an athlete has an accident, the camera attached to the helmet of the athlete can be ripped off.

Other solutions include quick release mechanisms which traditionally include a release mechanism which can be used to mount and dismount the camera rapidly. However, while quick release mechanism are designed to securely hold a camera, they can be accidentally disengaged causing the camera to fall out. This can result in damage to the camera and/or physical harm to a user from the camera impacting the body of the user.

BRIEF SUMMARY

One aspect of the present invention can include an apparatus for a screw coupler enabling direct secure fastening between communicating electronic components. A screw based coupler mechanism can include a head, a shank, and/or a helical ridge wrapped around the shank. The shank can include an electronic connector with one or more electronic pin outs. The shank can be configured to be physically and electronically mated to an electronic device. The electronic device can include a base and a hollow region surrounded by a matching helical ridge which securely mate the component to the shank. In one embodiment, the electronic device can be a panoramic camera which can be secured to a screw based coupler of a mounting platform.

Another aspect of the present invention can include an apparatus for a screw coupler enabling direct secure fastening between communicating electronic components. A camera can include a screw based coupling portion. The portion can include a head, a shank, and/or a helical ridge wrapped around the shank. The shank can include an electronic connector which can include one or more electronic pin outs. The shank can be configured to be physically and electronically mated to a screw coupler. The screw coupler component can include a hollow region surrounded by matching helical ridges which securely mate the component to the shank.

Yet another aspect of the present invention can include a system for a screw coupler enabling direct secure fastening between communicating electronic components. A screw based coupling system including a shank with an external thread and an electronic connector with a plurality of electronic pin outs, wherein the electronic connector is a portion of the shank or a base associated with the screw based coupling system, wherein the external threads is configured to securely mate an electronic device with the base.

DETAILED DESCRIPTION

The present disclosure is a solution for screw coupler enabling direct secure fastening between communicating electronic components. In the solution, a screw based coupler can be utilized to permit electronic components to be securely physically and electronically mated. In one instance, the screw based coupler can enable the coupling to create a weather proof and/or resistant seal between the components. In one embodiment, the screw based coupler can include a locking and release mechanism. In the embodiment, the locking mechanism can disable movement of the coupler which can prohibit fretting induced precession and the release mechanism can permit the components to be decoupled. In one instance, the screw based coupler can include dampeners which can protect electronic components from harmful environmental stresses. In the instance, the dampeners can include, but is not limited to, a vibrational dampener, a heat dampener, an acoustic dampener, and the like.

Figure 1:
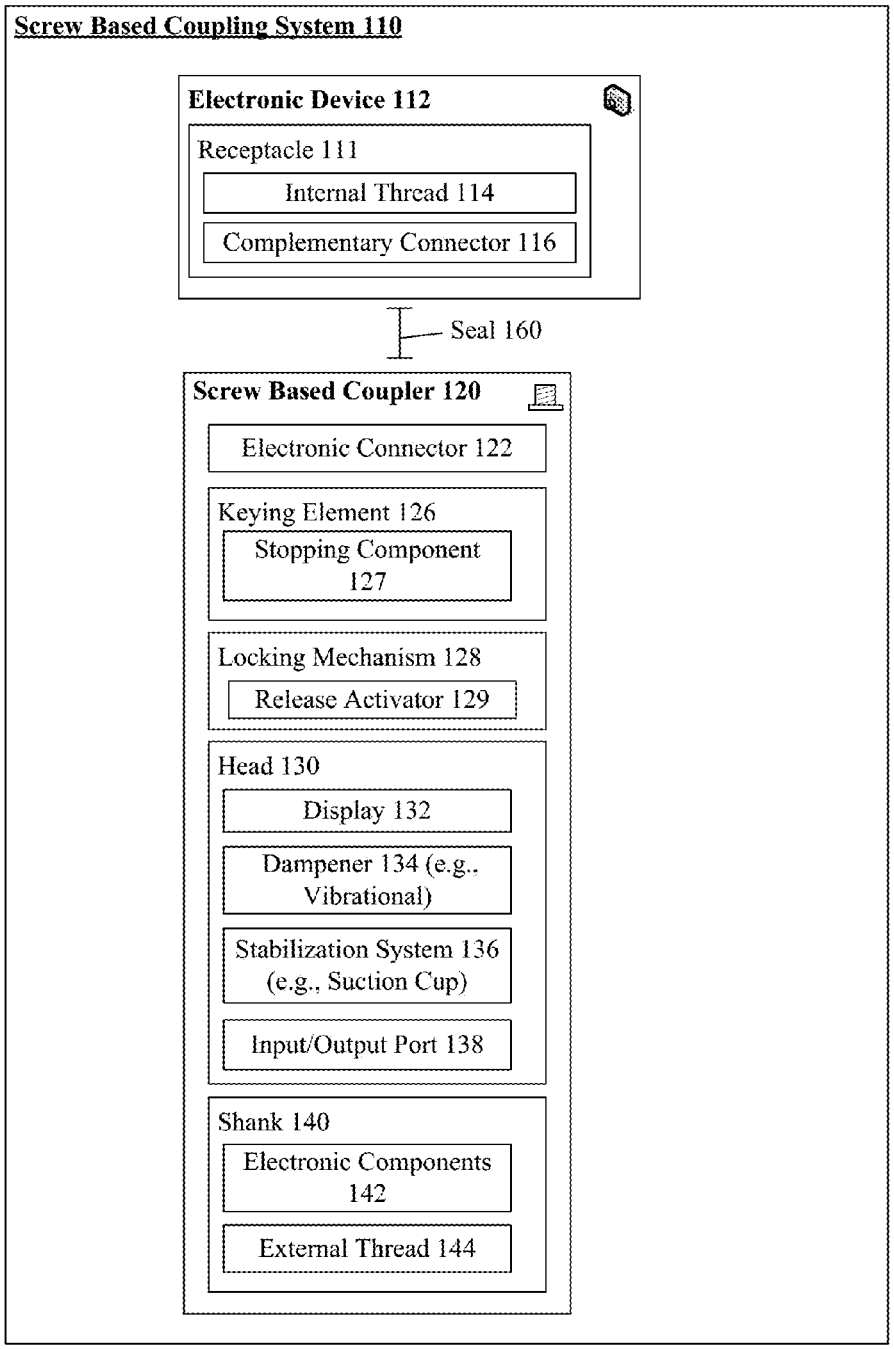
FIG. 1 is a schematic diagram illustrating a system for a screw coupler enabling direct secure fastening between communicating electronic components in accordance with an embodiment of the inventive arrangements disclosed herein.

FIG. 1 is a schematic diagram illustrating a system 110 for a screw coupler enabling direct secure fastening between communicating electronic components in accordance with an embodiment of the inventive arrangements disclosed herein. System 110 can be present in the context of embodiments 210, 310, 410, 440, 510. In system 110, a screw based coupler can be utilized to securely attach an electronic device to the coupler 120. In one embodiment, the coupler 120 can be a component of another electronic device. In one instance, the coupler 120 can be a component of device 112 and can be utilized to securely couple another electronic device and/or a structure. For example, screw based coupler 120 can be utilized to couple a camera to a base component (e.g., mounting surface) affixed to a wall. It should be appreciated that system 110 can include, but is not limited to electronic device 112, coupler 120, a computing device, a electronic device, and the like.

As used herein, electronic device 112 can be an entity with electrical circuits which include active/passive electrical elements. Electronic elements can include, but is not limited to, transistors, diodes, integrated circuits, passive interconnection technologies, and the like. In one instance, electronic device 112 can be a computing device such as a laptop, a desktop, a mobile phone, a smart phone, and the like. In one embodiment, electronic device 112 can be a camera, a portable multimedia device, and the like. For example, device 112 can be a panoramic camera utilized by athletes participating in adventure photography.

Device 112 can include, but is not limited to, a receptacle 111, electronic elements (not shown), and the like. Receptacle 111 can include, but is not limited to, an internal thread, a complementary connector 116, and the like. In one instance, device 112 can be fastened to screw based coupler 120 by mating the internal thread 114 of receptacle 111 of device 112 with the external thread 1144 of the shank 140 of coupler 120.

Screw based coupler 120 can include, but is not limited to, an electronic connector 122, a keying element 12, a locking mechanism 128, a head 130, a shank 140, and the like. It should be appreciated that coupler 120 can conform to traditional and/or proprietary physical forms including, but not limited to a screw type fastener, a bolt type fastener (e.g., bolt and nut), and the like. For example, coupler 120 shank and device 112 receptacle can be similar to a bolt and nut mechanism. In one embodiment, coupler 120 and electronic device components can be swapped. For example, coupler 120 can function as a nut mechanism and device 112 can function as a bolt mechanism. That is, device 112 can include a head and a shank which can be fitted into a receptacle 111 of screw based coupler 120. It should be appreciated that, a bolt can be an externally threaded fastener designed for insertion through holes in assembled parts, and can be tightened or released by torquing a nut. It should be understood that, a screw is an externally threaded fastener capable of being inserted into holes in assembled parts, of mating with a preformed internal thread and can be tightened or released by torquing the head. It should be appreciated that coupler 120 can vary in size and shape and can conform to any traditional and/or proprietary shape. For example, coupler 120 can be significantly larger and heavier than device 112 as to function as a mounting point for the device 112.

As used herein thread 114, 144 can include a screw thread which can be a helical structure used to convert between rotational and linear movement or force. Thread 114, 144 can be include a ridge wrapped around a cylinder or cone in the form of a helix, with the former being called a straight thread and the latter called a tapered thread. Thread 114, 144 can function as a simple machine and as a fastener. The mechanical advantage of a coupler 120 can depends on the lead, which can be the linear distance the screw travels in one revolution. It should be appreciated that the lead of a thread 114, 144 can be chosen so that friction is sufficient to prevent linear motion being converted to rotary, that is so the screw does not slip even when linear force is applied so long as no external rotational force is present. That is, the disclosure can permit secure mating of device 112 to coupler 120 in applications where significant linear force can be present upon the device 112 and coupler 120. It should appreciated that every matched pair of threads, external 144 and internal 114, can be described as one of two genders (e.g., male and female).

Electronic connector 122 and complementary connector 116 can be an electro-mechanical component for joining electronic circuits as an interface using a mechanical assembly. Connector 122, 116 can conform to traditional and/or proprietary connectors including, but not limited to, plug and socket connectors, contact pins, (Bayonet Neill-Concelman) BNC connectors, and the like. In one embodiment, coupler 120 can include an inner/outer sleeve which can move (e.g., rotate) independently of connector 122. That is, connector 122 can be unaffected by the rotation of shank 140. It should be appreciated that connect 122, 116 can permit the electronic connection of device 112 and coupler 120. That is, device 11 and coupler 120 can be communicatively linked when coupler 120 is fastened to device 112. It should be appreciated that electronic connectors 116, 122 can be characterized by pin out configuration, physical construction, size, contact resistance, insulation between pins, ruggedness and resistance to vibration, resistance to entry contaminants (e.g., water), resistance to pressure, reliability, lifetime (number of connect/disconnect operations before failure), ease of connecting and disconnecting, and the like.

Keying element 126 can be a mechanism for alignment of shank 140 with receptacle 111. Element 126 can include, but is not limited to, stopping component 127, a keying indicator (not shown), and the like.

In one embodiment, element 126 can be a simple visual indicator to permit the proper alignment of shank 140 with receptacle 111 prior to fastening. For example, element 126 can include a red dot on receptacle 111 and shank 140 (e.g., or head 130) to indicate an appropriate starting point for rotating shank 140 into receptacle 111. That is, aligning the red dots on the receptacle 111 and head 140 can yield successful threading of the shank 140 into receptacle 111. In one instance, element 126 can include a stopping element 127 which can prevent over-fastening of coupler 120 to device 112. In the instance, element 127 can be a contact point which can prohibit rotational and/or linear movement of the shank 140 or head 130 upon successful fastening. For example, element 127 can include a protrusion on receptacle 111 and a protrusion on head 130 which can contact each other upon successful fastening and can restrict further fastening. It should be appreciated that element 126 can be arbitrarily complex and can include traditional and/or proprietary functionality/elements.

In one instance, keying element 126 can prevent insertion of coupler 120/device 112 in the wrong orientation (e.g., resulting in cross threading, connecting the connector 122, 116 incorrectly). Keying element 126 functionality can permit certain pin outs of connector 116, 122 to make contact before others when inserted and/or break first on disconnection. That is, keying element can protect circuits typically in connectors that apply power (e.g., connecting safety ground first) and sequencing connections properly in hot swapping applications.

Locking mechanism 128 can be a mechanical linkage which can prevent separation of coupler 120 from device 112 upon mating. Mechanism 128 can include, but is not limited to, a release activator 128, a locking indicator (not shown), and the like. In one instance, mechanism can conform to traditional and/or proprietary locking linkages. In the instance, the mechanism can be automatically locked via rotational movement of the shank 140 when the shank 140 contacts a maximum fastened position and released via a release activator residing on device 112. For example, mechanism 128 can be similar to a Single Lens Reflex (SLR) camera lens mount mechanical linkage to a SLR camera body. It should be appreciated that a locking indicator can be presented upon successful locking of mechanism 128. For example, a visual and/or audible indicator of the locking (e.g., audible click) and releasing of mechanism 128 can be presented. It should be appreciated that mechanism 128 can include a traditional/proprietary key and lock mechanism (e.g., mechanical/electronic). For example, coupler 120 can be locked to device 112 via a security key (e.g., Tubular key) and matching security lock (e.g., Tubular lock) attached to the coupler 120.

Head 130 can be formed section on one end of the coupler 120 which can allow the coupler 120 to be driven (e.g., rotated). Head 130 can include, but is not limited to, a display 132, a dampener 134, a stabilization system 130, an input/output port 138, and the like. In one instance, head 130 can be larger than the shank 140 of coupler 120 which can prevent shank 140 from being driven deeper than the length of the shank 140. In the instance, head 130 can provide a bearing surface for contacting electronic device 112. Head 130 can conform to traditional and/or proprietary shapes and can include, but is not limited to, a pan shape, a dome shape, a round shape, a truss (e.g., mushroom), a flat shape (e.g., countersink), an oval shape (e.g., raised head), and the like. In one embodiment, head 130 can include a traditional and/or proprietary screw drive mechanism. That is, coupler 120 can be fastened with a tool which can contact the head 130. It should be appreciated that coupler 120 can be manually fastened to device 112 without the use of tools (e.g., with hands).

In one instance, head 130 can conform to traditional and/or proprietary organizations. In the instance, head 130 be circular, square, hexagonal, and the like. In one embodiment, head 130 ergonomics can conform to traditional and/or proprietary schemes. For example, head 130 can include ridged sections which can aid in gripping (e.g., fastening, unfastening) coupler 120.

In one embodiment, head 130 can include a display 132 which can present information associated with device 112 and/or electronic components 142. In the embodiment, can be an active and/or passive display including, but not limited to, electrophoretic ink (e-INK) display, Liquid Crystal Display (LCD), Organic Light Emitting Diode (OLED), and the like. For example, display 132 can be a "connected" LED indicator which can indicate successful coupling of device 112 and coupler 120. In one instance, a keying indicator and/or locking indicator can be presented upon display 132.

Dampener 134 can be one or more elements for protecting coupler 120, device 112, and/or the seal 160 formed from the fastening of coupler 120 and device 112. Dampener 134 can be a hardware washer such as a gasket, an O-ring, and the like. Dampener 134 material can include traditional and/or proprietary materials such as polymers (e.g., plastic), silicone, rubber, polytetrafluoroethylene (PTFE), and the like. It should be appreciated that dampener 134 can aid in creating a seal 160 which can be weather-proof, weather-resistant, and the like. Dampener 134 can be utilized to reduce environmental stresses on seal 160, coupler 120, and/or device 112. Stresses can include, but is not limited to, temperature, moisture, compression, decompression, and the like. In one embodiment, dampener 134 can be a vibrational dampener which can reduce vibrational energy transferred to/from device 112.

Stabilization system 136 can be a mechanism for temporarily and/or permanently affixing coupler 120 to a structure. The structure can include a mobile structure and a stationary structure. In one embodiment, system 136 can be a component of a mounting platform (e.g., tripod). In one instance, system 136 can be a suction cup which can permit the coupler 120 to be affixed to a smooth surface. It should be appreciated that system 136 can utilize traditional and/or proprietary stabilization systems 136 including, but not limited to, active (e.g., gyroscopic stabilization), passive stabilization, and the like.

Input/ouput port 138 can be one or more physical interfaces which can permit the transmission of power and/or data. Port 138 can conform to traditional and/or proprietary specifications. Port 138 can include, but is not limited to, a power cable port, a data port, and the like. For example, port 138 can be an High Definition Multimedia Interface (HDMI) or a Universal Serial Bus (USB) port (e.g., Mini-A USB).

Shank 140 can be an extrusion connected to the head 130 of coupler 120. Shank 140 can include, but is not limited to electronic components 142, external thread 144, and the like. It should be appreciated that shank 140 can be straight or tapered. In one embodiment, shank 140 can lack external threads 144. In the embodiment, external threads 144 can be a physical property of head 130 permitting the head 130 to fasten to receptacle 111. Electronic components 142 can include, but is not limited to, transistors, diodes, integrated circuits, passive interconnection technologies, and the like. In one instance, components 142 can include, a power source, a memory (e.g., non-volatile, volatile), a processor, and the like.

External thread 144, internal thread 114 can conform to traditional handedness such as right-handed threaded and left-handed threaded. Thread 144, 114 cross-sectional shape (e.g., threadform) can be square, triangular, trapezoidal, and the like. It should be appreciated that thread 144, 114 can conform to traditional and/or proprietary lead, pitch, and start properties.

It should be appreciated that coupler 120 can be utilized to achieve any traditional classes of fit including class 1, class 2, and class 3 fits.

Drawings presented herein are for illustrative purposes only and should not be construed to limit the invention in any regard. It should be appreciated that one or more components of device 112 and/or coupler 120 can be optional elements permitting the functionality of the disclosure is retained. It should be appreciated that system 110 can include additional components permitting the functionality of the disclosure is retained. In one instance, coupler 120 can permit a vacuum seal can be formed between device 112 and coupler 120. It should be appreciated that system 110 can permit angled anchoring of device 112. It should be understood that system 110 can permit self locking anchoring of the device 112.

Figure 2:
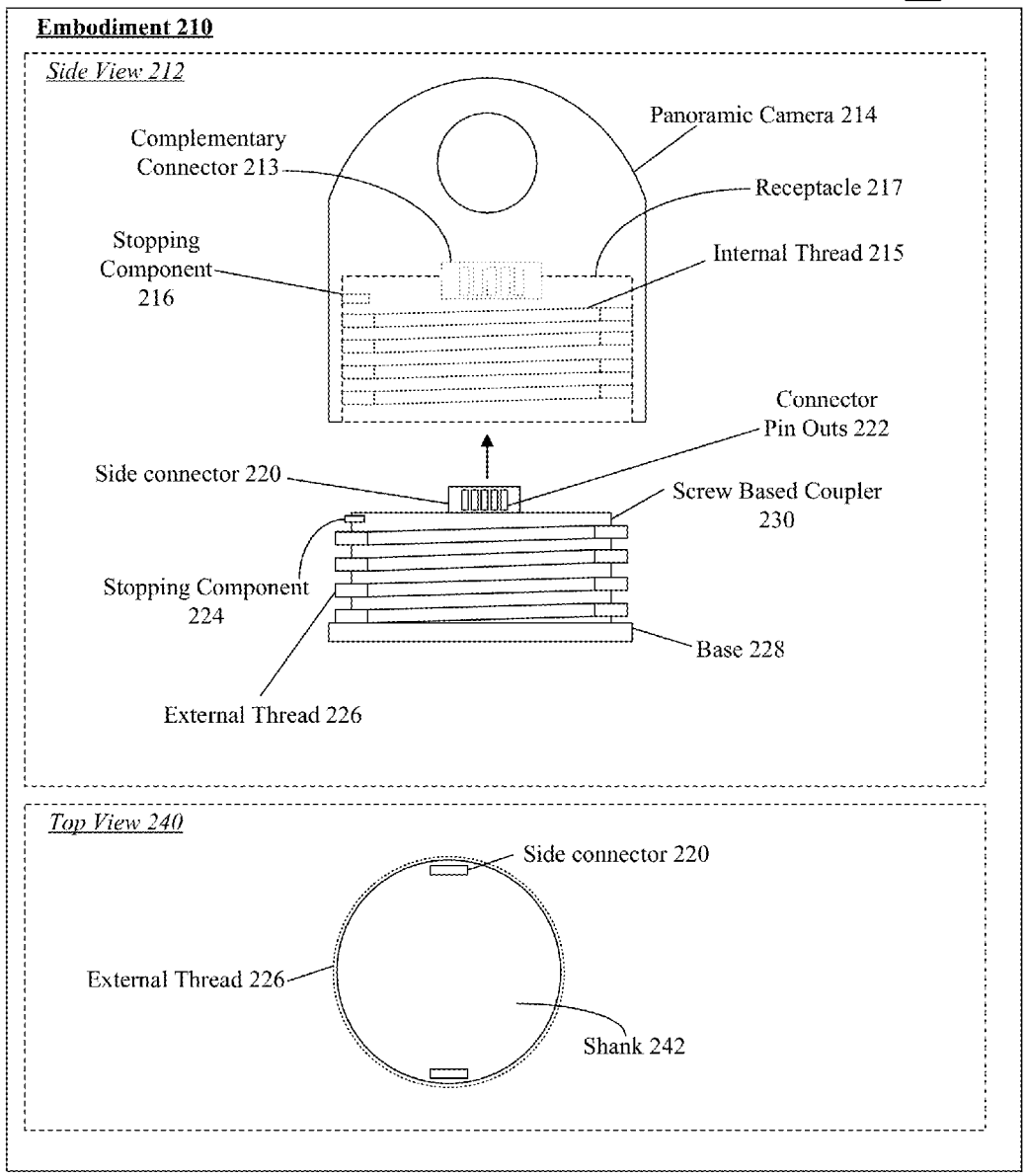
FIG. 2 is a schematic diagram illustrating an embodiment for a screw coupler enabling direct secure fastening between communicating electronic components in accordance with an embodiment of the inventive arrangements disclosed herein.

FIG. 2 is a schematic diagram illustrating an embodiment 210 for a screw coupler enabling direct secure fastening between communicating electronic components in accordance with an embodiment of the inventive arrangements disclosed herein. Embodiment 210 can be present in the context of system 110, and/or embodiments 310, 410, 440, 510. Embodiment 210 can present a side view 212 and a top view 240 of a screw based coupler 230. In the embodiment 210, coupler 230 can be fastened to a panoramic camera. For example, coupler 230 can be a mount which can be fastened to a 360 degree camera permitting the camera to be mounted onto a helmet or the roof of a car. It should be appreciated that operation of camera 214 can be unaffected by the fastening operation of coupler 230.

Embodiment 210 can include a screw based coupler 230 and a panoramic camera 214. Screw based coupler 230 can include, but is not limited to, a side connector, a connector pin outs 222, a stopping component 224, a base 228, an external thread 226, shank 242, and the like. Camera 214 can include, but is not limited to, complementary connector 213, stopping component 216, receptacle 217, internal thread 215, and the like.

In side view 212, screw based coupler 230 can be rotationally fastened to a receptacle of a camera 214. For example, a user can screw coupler 230 into a camera 214 with their hands. In side view 212, external thread 226 can be mated to internal thread 215, permitting side connector 220 to be connected to complementary connector 213. In one instance, stopping component 216, 224 can contact upon fastening to permit the alignment of connector pin outs 222 of connector 220 with the pin outs of connector 213. In the embodiment 210, side connector 220 can permit the pin outs 222 to remain protected from the rotational force exerted on coupler 230.

Top view 240 can illustrate one configuration for the side connector 220 position. In one configuration, connector 220 can be attached to the shank 242 of the coupler 230. In the configuration, connector 220 can be positioned away from the edges of the shank 242. The exact position of connector 220 can be dependent on the receptacle 217, connector 213, and/or camera 214 assembly.

Drawings presented herein are for illustrative purposes only and should not be construed to limit the invention in any regard. It should be appreciated that the size and quantity of connector 220 can vary based on camera 214 configuration/organization.

Figure 3:
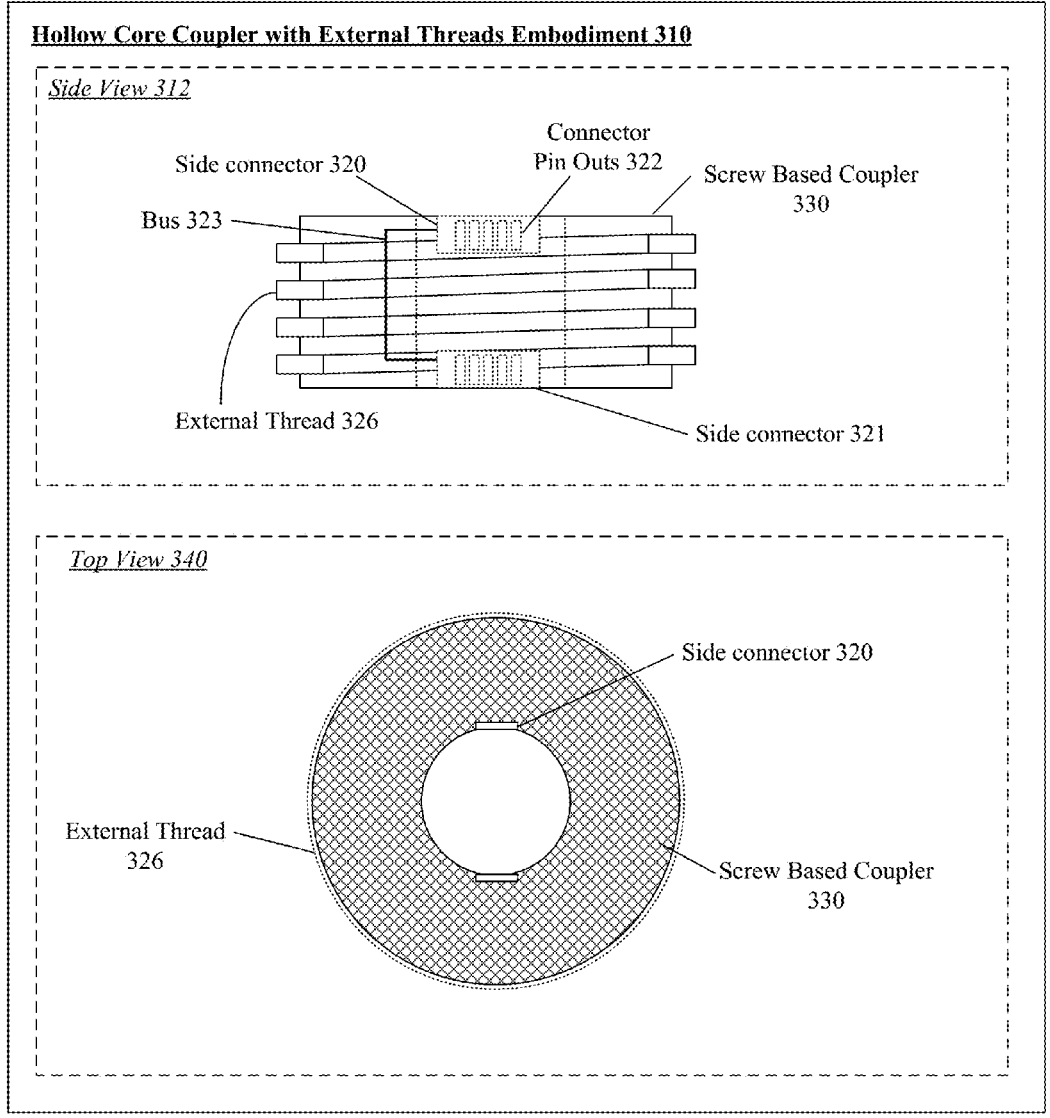
FIG. 3 is a schematic diagram illustrating an embodiment for a screw coupler enabling direct secure fastening between communicating electronic components in accordance with an embodiment of the inventive arrangements disclosed herein.

FIG. 3 is a schematic diagram illustrating an embodiment 310 for a screw coupler enabling direct secure fastening between communicating electronic components in accordance with an embodiment of the inventive arrangements disclosed herein. Embodiment 310 can be present in the context of system 110, and/or embodiments 210, 410, 440, 510. In embodiment 310, a screw based coupler 330 can include a hollow core which can permit the fastening of two different electronic components together. Embodiment 310 can include a side view 312 and a top view 340.

Embodiment 310 can include, but is not limited to a side connector 320, 321, a connector pin outs 322, a bus 323, an external thread 326, and the like. In the embodiment, coupler 330 can include a bus 323 which can communicatively link connector 320, 321.

In side view 312, connector 320, 321 can be recessed within a hollow portion of coupler 330. It should be appreciated that coupler 330 can lack a base, include a single base, or two bases.

In top view 340, side connector 320, 321 can be shown to be recessed within the wall of the hollow portion. That is, connector 320 can be protected from easily protected from environmental contaminants.

Drawings presented herein are for illustrative purposes only and should not be construed to limit the invention in any regard. In one instance, coupler 330 can include a flat base which can permit a electronic device to be fitted against the base allowing the connector 320, 321 to make contact with a connector(s) of electronic device.

Figure 4:
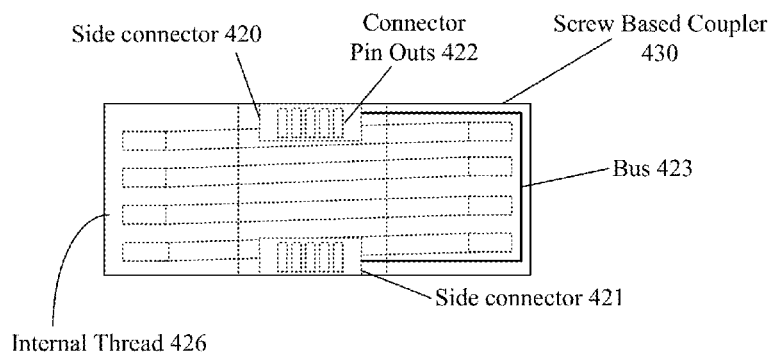
FIG. 4 is a schematic diagram illustrating a set of embodiments for a screw coupler enabling direct secure fastening between communicating electronic components in accordance with an embodiment of the inventive arrangements disclosed herein.
Figure 4:
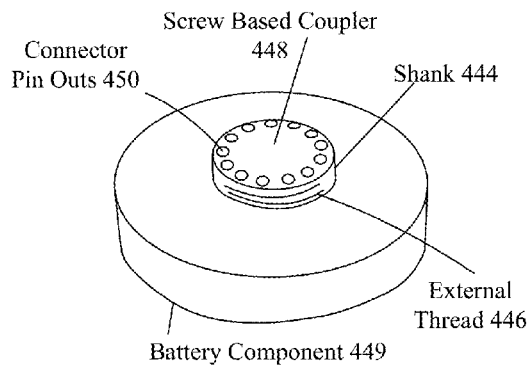

FIG. 4 is a schematic diagram illustrating a set of embodiments 410, 440 for a screw coupler enabling direct secure fastening between communicating electronic components in accordance with an embodiment of the inventive arrangements disclosed herein. Embodiments 410, 440 can be present in the context of system 110, and/or embodiments 310, 410, 440, 510. In embodiment 410, a screw based coupler 430 can include a hollow core with an internal thread 426. In embodiment 440, a screw based coupler 448 can include connector pin outs 450 residing on the top face of the shank 444 of coupler 448.

In embodiment 410, a screw based coupler 430 can function as a screw coupler permitting two electronic components to be mated together. In the embodiment 410, the coupler can include a side connector 420, 421 which can be recessed within the coupler 430. Coupler 430 can include a bus 423 which can communicatively link connector 420, 421. In one instance, bus 423 can be present between the external and internal wall of coupler 430.

In embodiment 440, a screw based coupler 448 can be a portion of a battery component which can be attached to a device having a matching coupler thread. Coupler 448 can include, but is not limited to, a shank 444, an external thread 446, connector pin outs 450, and the like. In the isometric view 442, a battery component 449 can be a portion of a head (e.g., base) of coupler 448. Coupler 448 can include one or more connector pin outs 450 on the top face of the shank 444. In one instance, pin outs 450 can be contact pin outs which can mate with a complementary connector pin out configuration.

Drawings presented herein are for illustrative purposes only and should not be construed to limit the invention in any regard.

Figure 5:
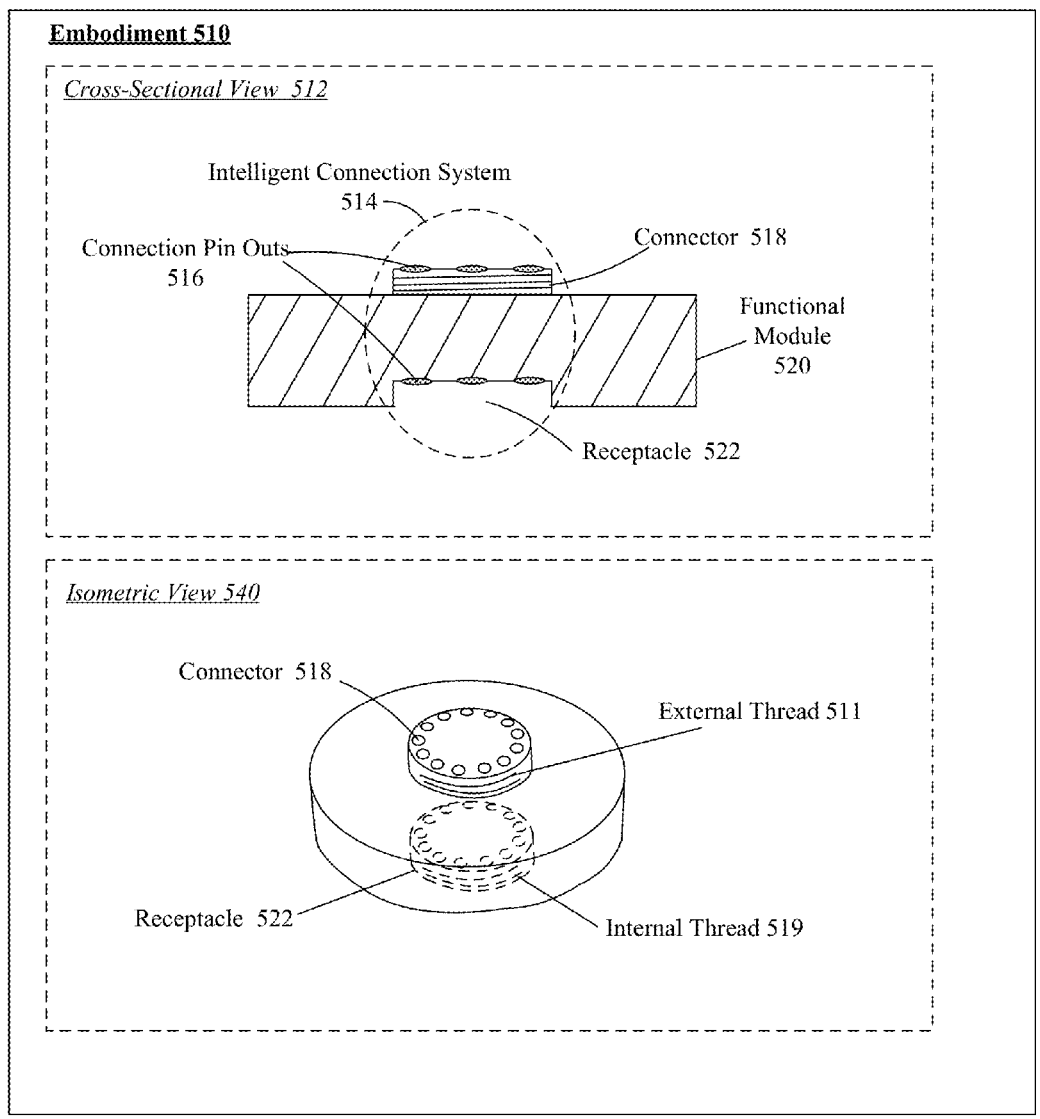
FIG. 5 is a schematic diagram illustrating an embodiment for a screw coupler enabling direct secure fastening between communicating electronic components in accordance with an embodiment of the inventive arrangements disclosed herein.

FIG. 5 is a schematic diagram illustrating an embodiment 510 for a screw coupler enabling direct secure fastening between communicating electronic components in accordance with an embodiment of the inventive arrangements disclosed herein. Embodiment 510 can be present in the context of system 110, embodiments 210, 310, 410, 440. Embodiment 510 can illustrate an intelligent connection system associated with a screw based coupler system (e.g., system 110). In the embodiment 510, a cross-sectional view 512 and an isometric view 540 can be presented.

In cross-sectional view 512, a functional module 520 can include an intelligent connection system 514. System 514 can include a connector 518, a receptacle 522, and the like. In one instance, the system 514 can permit stacking of electronic modules (e.g., computing components) into a functional electronic device. In one embodiment, system 514 can include hot swap functionality permitting components to removed and added to connector 518 and/or receptacle 522 in real-time or near real-time. In one instance, pin outs 516 can communicatively link components attached to connector 518 and receptacle 522.

In isometric view 540, positioning of the connector 518 and the receptacle 522 can be shown. In one embodiment, connector 518 and receptacle 522 can be centered within module 520. In the embodiment connector 518 can reside above receptacle 522 permitting centered stacking of module components.

Different module types are contemplated for the functional modules 520. Module types may include, for example, a power supply module, a communications module, a control module, a camera module, and various sensor modules. Sensor modules may include, but are not limited to, heart rate monitors, speed sensors, cadence sensors, foot pods, power meters, activity monitors, calorimeters, mass body index measuring devices, blood pressure monitors, blood glucose meters, pulse oximeters, position tracking components, short range homing beacons, weight measuring devices, temperature sensors, humidity sensors, and the like.

The flowchart and block diagrams in the FIGS. 1-5 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function (s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A camera with a screw based coupling mechanism comprising:
    a camera comprising of a screw based coupling portion, wherein the portion comprises a head, a shank, and a helical ridge wrapped around the shank, wherein the shank comprises of an electronic connector, wherein the connector comprises of a plurality of electronic pin outs, wherein the shank is configured to be physically and electronically mated to a screw coupler component, wherein the screw coupler component comprises of a hollow region surrounded by matching helical ridges which securely mate the screw coupler component to the shank, wherein the pin-outs are contact pin-outs arranged in a circular arrangement around a circumference of a plane of the shank to which a plane of the head having complementary pin-outs mates when the shank and the head are rotatably coupled together, wherein the screw based coupling portion further comprises:
        a keying element that protects a circuit formed when the electronic connector is attached by ensuring connections of the electronic pin outs are sequenced such that specific ones of the electronic pin outs make contact before other ones of the connector pin outs to ensure a safety ground is connected electronically before a contact providing power.

2. The camera of claim 1, wherein the camera is a panoramic camera.

3. The camera of claim 1, wherein the mating of the screw based coupling portion of the camera and the screw coupler component creates a weatherproof seal between the camera and the screw coupler.

4. The camera of claim 1, wherein the coupling portion comprises of a locking mechanism, wherein the mechanism secures the camera to the screw coupler component prohibiting at least one of precession and fretting induced precession.

5. The camera of claim 1, wherein the screw coupler component is configured to physically and electronically mate the camera with a different electronic device, wherein the camera and the different electronic device is communicatively linked.

6. A system for a screw based coupler comprising:
    a screw based coupling system comprising a plurality of functional modules, which includes a camera module, said screw based coupling system having a head and a shank at substantially opposing ends, wherein the functional module is able to be stacked to form an integrated electronic device having an enhanced functionality as provided by the functional module, wherein physical and electronic support of the functional module is provided by a screw based coupler that provides electronic and mechanical coupling for the module, wherein the shank comprises of an electronic connector, wherein the connector comprises of a plurality of electronic pin outs, wherein the pin-outs are contact pin-outs arranged in a circular arrangement around a circumference of a plane of the shank to which a plane of the head having complementary pin-outs mates when the shank and the head are rotatably coupled together, wherein a functional device lacking the enhanced functionality as provided by the functional module results by directly connecting a top-most component connected a head side of the functional module and a bottom-component connected to a shank side of the functional module to each other, wherein the functional modules include at least one module selected from a group comprising, a power supply module, a communications module, a control module, a storage module, and a sensor module, wherein the shank of the functional module has at least one external thread and an electronic connector with a plurality of electronic pin outs, wherein the electronic connector is a portion of the shank or a base associated with the screw based coupling system, wherein the external threads is configured to securely mate an electronic device with the base.

7. The system of claim 6, wherein the functional module is a sensor module that is a speed sensor, a position tracking component, or a temperature sensor.

8. The system of claim 6, further comprising of at least one of:
    a keying element configured to align the shank with a receptacle of the base or the electronic device; and
    a locking mechanism able to significantly decrease precession of the shank from a mated receptacle.

9. The system of claim 6, wherein the electronic device is a modular panoramic camera, wherein the system is configured to physically and electronically mate the camera with a plurality of compatible multiple modules, each of which is one type of functional module.

10. An electronic device with a screw based coupler comprising:
    a plurality of functional modules, which includes a camera module, said electronic device having a head and a shank at substantially opposing ends, wherein each of the functional modules is able to be stacked to form the electronic device having an enhanced functionality as provided by the functional module, wherein physical and electronic support of the functional module is provided by a screw based coupler that provides electronic and mechanical coupling for the module, wherein the shank comprises of an electronic connector, wherein the connector comprises of a plurality of electronic pin outs, wherein the pin-outs are contact pin-outs arranged in a circular arrangement around a circumference of a plane of the shank to which a plane of the head having complementary pin-outs mates when the shank and the head are rotatably coupled together, wherein a functional device lacking the enhanced functionality as provided by the functional module results by directly connecting a top-most component connected a head side of the functional module and a bottom-component connected to a shank side of the functional module to each other, wherein the functional modules include at least one module selected from a group comprising, a power supply module, a communications module, a control module, a storage module, and a sensor module, wherein the shank of the functional module has at least one external thread and an electronic connector with a plurality of electronic pin outs, wherein the electronic connector is a portion of the shank or a base associated with the screw based coupling system, wherein the external threads is configured to securely mate the electronic device with the base.

11. The electronic device of claim 10, wherein the functional module is a sensor module that is a speed sensor, a position tracking component, or a temperature sensor.

12. The electronic device of claim 10, further comprising of at least one of:
 a keying element configured to align the shank with a receptacle of the base or the electronic device; and
 a locking mechanism able to significantly decrease precession of the shank from a mated receptacle.

13. The electronic device of claim 10, wherein the electronic device is a modular panoramic camera configured to physically and electronically mate the camera with a plurality of compatible multiple modules, each of which is one type of functional module.

* * * * *